(12) United States Patent
Van Groos (10) Patent No.: US 8,003,308 B2
(45) Date of Patent: Aug. 23, 2011

(54) LITHOGRAPHIC APPARATUS AND DEVICE MANUFACTURING METHOD FOR WRITING A DIGITAL IMAGE

(75) Inventor: Pieter Johannes Marius Van Groos, Geldrop (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 12/775,073

(22) Filed: May 6, 2010

(65) Prior Publication Data
US 2010/0209856 A1 Aug. 19, 2010

Related U.S. Application Data

(62) Division of application No. 11/147,466, filed on Jun. 8, 2005, now Pat. No. 7,742,148.

(51) Int. Cl.
*G03F 7/20* (2006.01)

(52) U.S. Cl. ......... 430/321; 430/320; 430/394; 430/311

(58) Field of Classification Search .................. 430/394, 430/313, 321, 320, 319, 311, 397
See application file for complete search history.

(56) References Cited

U.S. PATENT DOCUMENTS

| | | | |
|---|---|---|---|
| 5,229,872 A | 7/1993 | Mumola | |
| 5,296,891 A | 3/1994 | Vogt et al. | |
| 5,461,411 A * | 10/1995 | Florence et al. | 347/240 |
| 5,500,736 A | 3/1996 | Koitabashi et al. | |
| 5,523,193 A | 6/1996 | Nelson | |
| 5,530,482 A | 6/1996 | Gove et al. | |
| 5,579,147 A | 11/1996 | Mori et al. | |
| 5,677,703 A | 10/1997 | Bhuva et al. | |
| 5,808,797 A | 9/1998 | Bloom et al. | |
| 5,982,553 A | 11/1999 | Bloom et al. | |
| 6,133,986 A | 10/2000 | Johnson | |
| 6,177,980 B1 | 1/2001 | Johnson | |
| 6,687,041 B1 | 2/2004 | Sandstrom | |
| 6,747,783 B1 | 6/2004 | Sandstrom | |
| 6,795,169 B2 | 9/2004 | Tanaka et al. | |
| 6,806,897 B2 | 10/2004 | Kataoka et al. | |
| 6,811,953 B2 | 11/2004 | Hatada et al. | |
| 7,023,526 B2 | 4/2006 | Latypov et al. | |

(Continued)

FOREIGN PATENT DOCUMENTS

JP 61-128631 U 8/1986

(Continued)

OTHER PUBLICATIONS

Notification of Reasons for Refusal mailed Feb. 9, 2010 for Japanese Patent Application No. 2006-157931, 3 pgs.

(Continued)

*Primary Examiner* — Kathleen Duda
*Assistant Examiner* — Caleen O Sullivan
(74) *Attorney, Agent, or Firm* — Sterne, Kessler, Goldstein & Fox P.L.L.C.

(57) ABSTRACT

A device manufacturing method is provided. The method includes generating a first patterned beam, projecting the first patterned beam onto a substrate to form a first plurality of spot exposures on the substrate, scanning the substrate in a direction while projecting the first patterned beam, generating a second patterned beam, projecting the second patterned beam onto the substrate to form a second plurality of spot exposures on the substrate, and alternating spot exposures of the first plurality of spot exposures with respective spot exposures of the second plurality of spot exposures.

11 Claims, 7 Drawing Sheets

U.S. PATENT DOCUMENTS

| | | | |
|---|---|---|---|
| 7,499,146 | B2 | 3/2009 | Troost et al. |
| 7,732,148 | B2 | 6/2010 | Cahill et al. |
| 2002/0097495 | A1 | 7/2002 | Mei |
| 2004/0041104 | A1 | 3/2004 | Liebregts et al. |
| 2004/0069957 | A1* | 4/2004 | Menon et al. .............. 250/492.2 |
| 2004/0130561 | A1 | 7/2004 | Jain |
| 2005/0007572 | A1 | 1/2005 | George et al. |

FOREIGN PATENT DOCUMENTS

| | | |
|---|---|---|
| JP | 62-160437 A | 7/1987 |
| JP | 6-160888 A | 6/1994 |
| JP | 2003-195512 A | 7/2003 |
| JP | 2005-109510 A | 4/2005 |
| WO | WO 97/34171 A2 | 9/1997 |
| WO | WO 98/33096 | 7/1998 |
| WO | WO 98/38597 | 9/1998 |
| WO | WO 99/00706 A1 | 1/1999 |
| WO | WO 03/040830 A2 | 5/2003 |

OTHER PUBLICATIONS

English language abstract of Japanese Publication No. JP2001500628T published Jan. 16, 2001, 1 pg.

English language abstract of Japanese Publication No. JP2002511980T published Apr. 16, 2002, 1 pg.

English Abstract for Japanese Utility Publication No. 61-128631U, "Liquid Crystal Projector", Casio Computer Co., Ltd, published Aug. 12, 1986, 2 pgs.

English Abstract for Japanese Publication No. 62-160437A, "Superposing Method for Projection Image", Kawasaki Heavy Ind., Ltd, published Jul. 16, 1987, 1 pg.

English Abstract for Japanese Publication No. 6-160888A, "Projector", Casio Computer Co., Ltd, published Jun. 7, 1994, 1 pg.

English Abstract for Japanese Publication No. 2003-195512A, "Apparatus and Method for Multiple Exposure Drawing", Pentax Corp, published Jul. 9, 2003, 1 pg.

Notice of Reasons for Refusal for Japanese Patent Application No. 2006-157931 mailed Aug. 11, 2009, 3 pgs.

Non-Final Office Action for U.S. Appl. No. 11/147,466, mailed Dec. 26, 2008, 6 pgs.

Final Office Action for U.S. Appl. No. 11/147,466, mailed Oct. 6, 2009, 7 pgs.

Final Office Action for U.S. Appl. No. 11/147,466, mailed Jun. 24, 2009, 9 pgs.

Decision of Refusal mailed Aug. 10, 2010 for Japanese Patent Application No. 2006-157931, 2 pgs.

* cited by examiner

LITHOGRAPHIC APPARATUS AND DEVICE MANUFACTURING METHOD FOR WRITING A DIGITAL IMAGE

CROSS-REFERENCE TO RELATED APPLICATIONS

This application is a divisional of U.S. Non-Provisional application Ser. No. 11/147,466, filed Jun. 8, 2005, which is incorporated herein in its entirety by reference.

BACKGROUND

1. Field

The present invention relates to a lithographic apparatus and a method for manufacturing a device.

2. Related Art

A lithographic apparatus is a machine that applies a desired pattern onto a substrate or part of a substrate. A lithographic apparatus can be used, for example, in the manufacture of flat panel displays, integrated circuits (ICs) and other devices involving fine structures. In a conventional apparatus, a patterning device, which can be referred to as a mask or a reticle, can be used to generate a circuit pattern corresponding to an individual layer of a flat panel display (or other device). This pattern can be transferred on (part of) the substrate (e.g., a glass plate), e.g., via imaging onto a layer of radiation-sensitive material (resist) provided on the substrate.

Instead of a circuit pattern, the patterning means can be used to generate other patterns, for example a color filter pattern or a matrix of dots. Instead of a mask, the patterning device can comprise a patterning array that comprises an array of individually controllable elements. The pattern can be changed more quickly and for less cost in such a system compared to a mask-based system.

A flat panel display substrate is typically rectangular in shape. Lithographic apparatus designed to expose a substrate of this type can provide an exposure region that covers a full width of the rectangular substrate, or which covers a portion of the width (for example half of the width). The substrate can be scanned underneath the exposure region, while the mask or reticle is synchronously scanned through the projection beam. In this way, the pattern is transferred to the substrate. If the exposure region covers the full width of the substrate then exposure can be completed with a single scan. If the exposure region covers, for example, half of the width of the substrate, then the substrate can be moved transversely after the first scan, and a further scan is typically performed to expose the remainder of the substrate.

When using a print head comprising an array of individually controllable elements, the print head may not extend across an entire width of the substrate. Thus, several print heads are used or the substrate is shifted relative to the print head once exposure of a first area has been completed. Furthermore, the pitch between individually controllable elements used in the print head can be much larger than the required pitch between spots exposed on the substrate. It can be difficult to fit sufficient print heads into the limited space available, so generally a combination of these two methods is used and the substrate is shifted relative to the plurality of print heads. However, the alignment of print heads with respect to each other may not be completely accurate. Furthermore, the shift of the substrate may not be exactly correct.

Both of these lead to so-called stitching errors due to the misalignment of printed pixels in the exposed areas. Although steps can be taken to reduce stitching errors, these all occur in the same area where the exposures from a first exposure by a first print head overlap with any other exposures. The spatial frequency of these areas of stitching can be visible to the human eye, thus reducing the image quality.

Therefore, what is needed is a system and method of exposing the substrates using arrays of individually controllable elements in which the effect of stitching is minimized.

SUMMARY

According to one embodiment of the invention, a device manufacturing method is provided. The method includes generating a first patterned beam, projecting the first patterned beam onto a substrate to form a first plurality of spot exposures on the substrate, scanning the substrate in a direction while projecting the first patterned beam, generating a second patterned beam, projecting the second patterned beam onto the substrate to form a second plurality of spot exposures on the substrate, and alternating spot exposures of the first plurality of spot exposures with respective spot exposures of the second plurality of spot exposures.

According to another embodiment of the invention, a device manufacturing method is provided. The method includes generating a first patterned beam, projecting the first patterned beam onto a substrate to generate a first plurality of spot exposures on the substrate, scanning the substrate in a first direction while projecting the plurality of radiation spots, shifting the substrate relative to the projection of the patterned beam in a second direction perpendicular to the first direction, generating a second patterned beam, projecting the second patterned beam onto the substrate to generate a second plurality of spot exposures on the substrate, and alternating spot exposures of the second plurality of spot exposures with respective spot exposures of the first plurality of spot exposures.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the invention and to enable a person skilled in the pertinent art to make and use the invention.

The present invention will now be described with reference to the accompanying drawings. In the drawings, like reference numbers can indicate identical or functionally similar elements. Additionally, the left-most digit(s) of a reference number can identify the drawing in which the reference number first appears.

DETAILED DESCRIPTION

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

Figure 1:
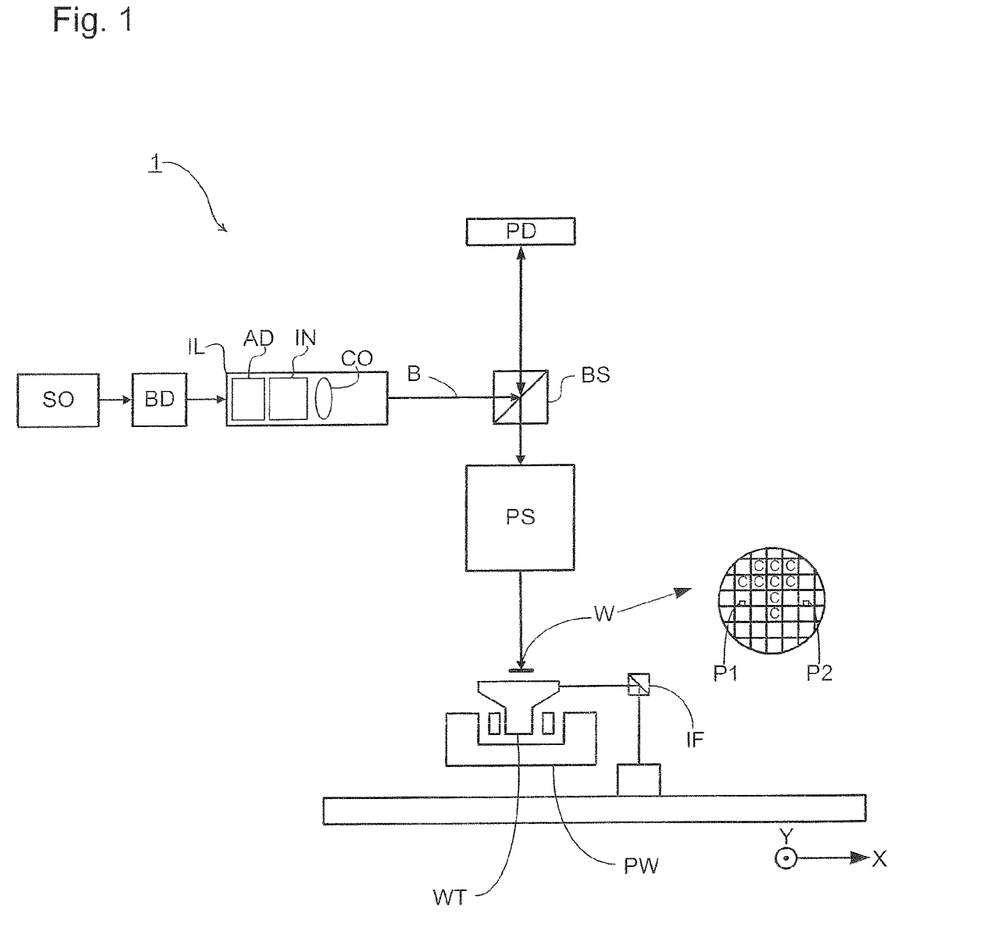
FIGS. 1 and 2 depict lithographic apparatus, according to various embodiments of the present invention.

FIG. 1 schematically depicts a lithographic apparatus according to one embodiment of the invention. The apparatus comprises an illumination system IL, a patterning device PD, a substrate table WT, and a projection system PS. The illumination system (illuminator) IL is configured to condition a radiation beam B (e.g., UV radiation).

The patterning device PD (e.g., a reticle or mask or an array of individually controllable elements) modulates the projection beam. In general, the position of the array of individually controllable elements will be fixed relative to the projection system PS. However, it can instead be connected to a positioner configured to accurately position the array of individually controllable elements in accordance with certain parameters.

The substrate table WT is constructed to support a substrate (e.g., a resist-coated substrate) W and connected to a positioner PW configured to accurately position the substrate in accordance with certain parameters.

The projection system (e.g., a refractive projection lens system) PS is configured to project the beam of radiation modulated by the array of individually controllable elements onto a target portion C (e.g., comprising one or more dies) of the substrate W.

The illumination system can include various types of optical components, such as refractive, reflective, magnetic, electromagnetic, electrostatic or other types of optical components, or any combination thereof, for directing, shaping, or controlling radiation.

The term "patterning device" or "contrast device" used herein should be broadly interpreted as referring to any device that can be used to modulate the cross-section of a radiation beam, such as to create a pattern in a target portion of the substrate. The devices can be either static patterning devices (e.g., masks or reticles) or dynamic (e.g., arrays of programmable elements) patterning devices. For brevity, most of the description will be in terms of a dynamic patterning device, however it is to be appreciated that a static pattern device can also be used without departing from the scope of the present invention.

It should be noted that the pattern imparted to the radiation beam may not exactly correspond to the desired pattern in the target portion of the substrate, for example if the pattern includes phase-shifting features or so called assist features. Similarly, the pattern eventually generated on the substrate may not correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes.

Generally, the pattern created on the target portion of the substrate will correspond to a particular functional layer in a device being created in the target portion, such as an integrated circuit or a flat panel display (e.g., a color filter layer in a flat panel display or a thin film transistor layer in a flat panel display). Examples of such patterning devices include, e.g., reticles, programmable mirror arrays, laser diode arrays, light emitting diode arrays, grating light valves, and LCD arrays.

Patterning devices whose pattern is programmable with the aid of electronic means (e.g., a computer), such as patterning devices comprising a plurality of programmable elements (e.g., all the devices mentioned in the previous sentence except for the reticle), are collectively referred to herein as "contrast devices." In one example, the patterning device comprises at least 10 programmable elements, e.g., at least 100, at least 1000, at least 10000, at least 100000, at least 1000000, or at least 10000000 programmable elements.

A programmable mirror array can comprise a matrix-addressable surface having a viscoelastic control layer and a reflective surface. The basic principle behind such an apparatus is that, e.g., addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter can filter out the diffracted light, leaving the undiffracted light to reach the substrate.

An array of diffractive optical MEMS devices (micro-electro-mechanical system devices) can also be used in a corresponding manner. In one example, a diffractive optical MEMS device is comprised of a plurality of reflective ribbons that can be deformed relative to one another to form a grating that reflects incident light as diffracted light.

A further alternative example of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors reflect an incoming radiation beam in a different direction to unaddressed mirrors; in this manner, the reflected beam can be patterned according to the addressing pattern of the matrix-addressable mirrors. The required matrix addressing can be performed using suitable electronic means.

Another example PD is a programmable LCD array.

The lithographic apparatus can comprise one or more contrast devices. For example, it can have a plurality of arrays of individually controllable elements, each controlled independently of each other. In such an arrangement, some or all of the arrays of individually controllable elements can have at least one of a common illumination system (or part of an illumination system), a common support structure for the arrays of individually controllable elements, and/or a common projection system (or part of the projection system).

In an example, such as the embodiment depicted in FIG. 1, the substrate W has a substantially circular shape, optionally with a notch and/or a flattened edge along part of its perimeter. In an example, the substrate has a polygonal shape, e.g., a rectangular shape.

In example where the substrate has a substantially circular shape include examples where the substrate has a diameter of at least 25 mm, for instance at least 50 mm, at least 75 mm, at least 100 mm, at least 125 mm, at least 150 mm, at least 175 mm, at least 200 mm, at least 250 mm, or at least 300 mm. In an embodiment, the substrate has a diameter of at most 500 mm, at most 400 mm, at most 350 mm, at most 300 mm, at most 250 mm, at most 200 mm, at most 150 mm, at most 100 mm, or at most 75 mm.

In examples where the substrate is polygonal, e.g., rectangular, include examples where at least one side, e.g., at least 2 sides or at least 3 sides, of the substrate has a length of at least 5 cm, e.g., at least 25 cm, at least 50 cm, at least 100 cm, at least 150 cm, at least 200 cm, or at least 250 cm.

In one example, at least one side of the substrate has a length of at most 100 cm, e.g., at most 750 cm, at most 500 cm, at most 350 cm, at most 250 cm, at most 150 cm, or at most 75 cm.

In one example, the substrate W is a wafer, for instance a semiconductor wafer. In one example, the wafer material is selected from the group consisting of Si, SiGe, SiGeC, SiC, Ge, GaAs, InP, and InAs. In one example, the wafer is a UV compound semiconductor wafer. In one example, the wafer is a silicon wafer. In an embodiment, the substrate is a ceramic substrate. In one example, the substrate is a glass substrate. In one example, the substrate is a plastic substrate. In one example, the substrate is transparent (for the naked human eye). In one example, the substrate is colored. In one example, the substrate is absent a color.

The thickness of the substrate can vary and, to an extent, can depend, e.g., on the substrate material and/or the substrate dimensions. In one example, the thickness is at least 50 $\mu$m, e.g., at least 100 $\mu$m, at least 200 $\mu$m, at least 300 $\mu$m, at least 400 $\mu$m, at least 500 $\mu$m, or at least 600 $\mu$m. In one example, the thickness of the substrate is at most 5000 $\mu$m, e.g., at most 3500 $\mu$m, at most 2500 $\mu$m, at most 1750 $\mu$m, at most 1250 $\mu$m, at most 1000 $\mu$m, at most 800 $\mu$m, at most 600 $\mu$m, at most 500 $\mu$m, at most 400 $\mu$m, or at most 300 $\mu$m.

The substrate referred to herein can be processed, before or after exposure, in for example a track (a tool that typically applies a layer of resist to a substrate and develops the exposed resist), a metrology tool, and/or an inspection tool. In one example, a resist layer is provided on the substrate.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein can be considered as synonymous with the more general term "projection system."

The projection system can image the pattern on the array of individually controllable elements, such that the pattern is coherently formed on the substrate. Alternatively, the projection system can image secondary sources for which the elements of the array of individually controllable elements act as shutters. In this respect, the projection system can comprise an array of focusing elements such as a micro lens array (known as an MLA) or a Fresnel lens array, e.g., to form the secondary sources and to image spots onto the substrate. In one example, the array of focusing elements (e.g., MLA) comprises at least 10 focus elements, e.g., at least 100 focus elements, at least 1000 focus elements, at least 10000 focus elements, at least 100000 focus elements, or at least 1000000 focus elements. In one example, the number of individually controllable elements in the patterning device is equal to or greater than the number of focusing elements in the array of focusing elements. In one example, one or more (e.g., 1000 or more, the majority, or about each) of the focusing elements in the array of focusing elements can be optically associated with one or more of the individually controllable elements in the array of individually controllable elements, e.g., with 2 or more of the individually controllable elements in the array of individually controllable elements, such as 3 or more, 5 or more, 10 or more, 20 or more, 25 or more, 35 or more, or 50 or more. In one example, the MLA is movable (e.g., with the use of actuators) at least in the direction to and away from the substrate, e.g., with the use of one or more actuators. Being able to move the MLA to and away from the substrate allows, e.g., for focus adjustment without having to move the substrate.

Figure 2:
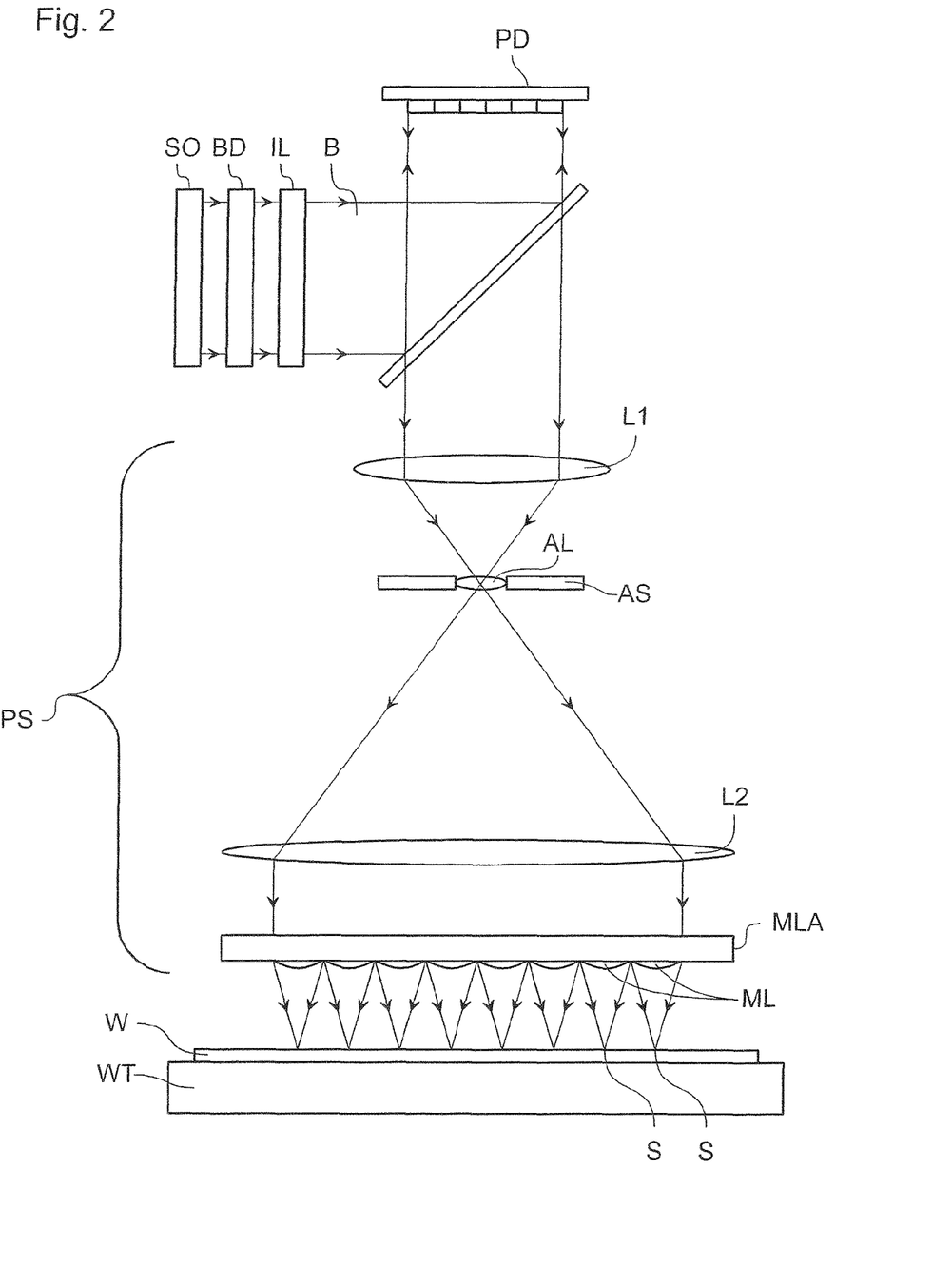

As herein depicted in FIGS. 1 and 2, the apparatus is of a reflective type (e.g., employing a reflective array of individually controllable elements). Alternatively, the apparatus can be of a transmissive type (e.g., employing a transmissive array of individually controllable elements).

The lithographic apparatus can be of a type having two (dual stage) or more substrate tables. In such "multiple stage" machines, the additional tables can be used in parallel, or preparatory steps can be carried out on one or more tables while one or more other tables are being used for exposure.

The lithographic apparatus can also be of a type wherein at least a portion of the substrate can be covered by an "immersion liquid" having a relatively high refractive index, e.g., water, so as to fill a space between the projection system and the substrate. An immersion liquid can also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring again to FIG. 1, the illuminator IL receives a radiation beam from a radiation source SO. In one example, the radiation source provides radiation having a wavelength of at least 5 nm, e.g., at least 10 nm, at least 50 nm, at least 100 nm, at least 150 nm, at least 175 nm, at least 200 nm, at least 250 nm, at least 275 nm, at least 300 nm, at least 325 nm, at least 350 nm, or at least 360 nm. In one example, the radiation provided by radiation source SO has a wavelength of at most 450 nm, e.g., at most 425 nm, at most 375 nm, at most 360 nm, at most 325 nm, at most 275 nm, at most 250 nm, at most 225 nm, at most 200 nm, or at most 175 nm. In one example, the radiation has a wavelength including 436 nm, 405 nm, 365 nm, 355 nm, 248 nm, 193 nm, 157 nm, and/or 126 nm. In one example, the radiation includes a wavelength of around 365 nm or around 355 nm. In one example, the radiation includes a broad band of wavelengths, for example encompassing 365, 405, and 436 nm. A 355 nm laser source could be used. The source and the lithographic apparatus can be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source can be an integral part of the lithographic apparatus, for example when the source is a mercury lamp. The source SO and the illuminator IL, together with the beam delivery system BD if required, can be referred to as a radiation system.

The illuminator IL, can comprise an adjuster AD for adjusting the angular intensity distribution of the radiation beam. Generally, at least the outer and/or inner radial extent (commonly referred to as $\sigma$-outer and $\sigma$-inner, respectively) of the intensity distribution in a pupil plane of the illuminator can be adjusted. In addition, the illuminator IL can comprise various other components, such as an integrator IN and a condenser CO. The illuminator can be used to condition the radiation beam to have a desired uniformity and intensity distribution in its cross-section. The illuminator IL, or an additional component associated with it, can also be arranged to divide the radiation beam into a plurality of sub-beams that can, for example, each be associated with one or a plurality of the individually controllable elements of the array of individually controllable elements. A two-dimensional diffraction grating can, for example, be used to divide the radiation beam into sub-beams. In the present description, the terms "beam of radiation" and "radiation beam" encompass, but are not limited to, the situation in which the beam is comprised of a plurality of such sub-beams of radiation.

The radiation beam B is incident on the patterning device PD (e.g., an array of individually controllable elements) and is modulated by the patterning device. Having been reflected by the patterning device PD, the radiation beam B passes through the projection system PS, which focuses the beam onto a target portion C of the substrate W. With the aid of the positioner PW and position sensor IF2 (e.g., an interferometric device, linear encoder, capacitive sensor, or the like), the substrate table WT can be moved accurately, e.g., so as to position different target portions C in the path of the radiation beam B. Where used, the positioning means for the array of individually controllable elements can be used to correct accurately the position of the patterning device PD with respect to the path of the beam B, e.g., during a scan.

In one example, movement of the substrate table WT is realized with the aid of a long-stroke module (course positioning) and a short-stroke module (fine positioning), which are not explicitly depicted in FIG. 1. In one example, the apparatus is absent at least a short stroke module for moving substrate table WT. A similar system can also be used to position the array of individually controllable elements. It will be appreciated that the projection beam B can alternatively/additionally be moveable, while the object table and/or the array of individually controllable elements can have a fixed position to provide the required relative movement. Such an arrangement can assist in limiting the size of the apparatus. As a further alternative, which can, e.g., be applicable in the manufacture of flat panel displays, the position of the substrate table WT and the projection system PS can be fixed and the substrate W can be arranged to be moved relative to the substrate table WT. For example, the substrate table WT can be provided with a system for scanning the substrate W across it at a substantially constant velocity.

As shown in FIG. 1, the beam of radiation B can be directed to the patterning device PD by means of a beam splitter BS configured such that the radiation is initially reflected by the beam splitter and directed to the patterning device PD. It should be realized that the beam of radiation B can also be directed at the patterning device without the use of a beam splitter. In one example, the beam of radiation is directed at the patterning device at an angle between 0 and 90°, e.g., between 5 and 85°, between 15 and 75°, between 25 and 65°, or between 35 and 55° (the embodiment shown in FIG. 1 is at a 90° angle). The patterning device PD modulates the beam of radiation B and reflects it back to the beam splitter BS which transmits the modulated beam to the projection system PS. It will be appreciated, however, that alternative arrangements can be used to direct the beam of radiation B to the patterning device PD and subsequently to the projection system PS. In particular, an arrangement such as is shown in FIG. 1 may not be required if a transmissive patterning device is used.

The depicted apparatus can be used in several modes:

1. In step mode, the array of individually controllable elements and the substrate are kept essentially stationary, while an entire pattern imparted to the radiation beam is projected onto a target portion C at one go (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the array of individually controllable elements and the substrate are scanned synchronously while a pattern imparted to the radiation beam is projected onto a target portion C (i.e., a single dynamic exposure). The velocity and direction of the substrate relative to the array of individually controllable elements can be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In pulse mode, the array of individually controllable elements is kept essentially stationary and the entire pattern is projected onto a target portion C of the substrate W using a pulsed radiation source. The substrate table WT is moved with an essentially constant speed such that the projection beam B is caused to scan a line across the substrate W. The pattern on the array of individually controllable elements is updated as required between pulses of the radiation system and the pulses are timed such that successive target portions C are exposed at the required locations on the substrate W. Consequently, the projection beam B can scan across the substrate W to expose the complete pattern for a strip of the substrate. The process is repeated until the complete substrate W has been exposed line by line.

4. In continuous scan mode, essentially the same as pulse mode except that the substrate W is scanned relative to the modulated beam of radiation B at a substantially constant speed and the pattern on the array of individually controllable elements is updated as the projection beam B scans across the substrate W and exposes it. A substantially constant radiation source or a pulsed radiation source, synchronized to the updating of the pattern on the array of individually controllable elements, can be used.

5. In pixel grid imaging mode, which can be performed using the lithographic apparatus of FIG. 2, the pattern formed on substrate W is realized by subsequent exposure of spots formed by a spot generator that are directed onto patterning device PD. The exposed spots have substantially the same shape. On substrate W the spots are printed in substantially a grid. In one example, the spot size is larger than a pitch of a printed pixel grid, but much smaller than the exposure spot grid. By varying intensity of the spots printed, a pattern is realized. In between the exposure flashes the intensity distribution over the spots is varied.

Combinations and/or variations on the above described modes of use or entirely different modes of use can also be employed.

In lithography, a pattern is exposed on a layer of resist on the substrate. The resist is then developed. Subsequently, additional processing steps are performed on the substrate. The effect of these subsequent processing steps on each portion of the substrate depends on the exposure of the resist. In particular, the processes are tuned such that portions of the substrate that receive a radiation dose above a given dose threshold respond differently to portions of the substrate that receive a radiation dose below the dose threshold. For example, in an etching process, areas of the substrate that receive a radiation dose above the threshold are protected from etching by a layer of developed resist. However, in the post-exposure development, the portions of the resist that receive a radiation dose below the threshold are removed and therefore those areas are not protected from etching. Accordingly, a desired pattern can be etched. In particular, the individually controllable elements in the patterning device are set such that the radiation that is transmitted to an area on the substrate within a pattern feature is at a sufficiently high intensity that the area receives a dose of radiation above the dose threshold during the exposure. The remaining areas on the substrate receive a radiation dose below the dose threshold by setting the corresponding individually controllable elements to provide a zero or significantly lower radiation intensity.

In practice, the radiation dose at the edges of a pattern feature does not abruptly change from a given maximum dose to zero dose even if the individually controllable elements are set to provide the maximum radiation intensity on one side of the feature boundary and the minimum radiation intensity on the other side. Instead, due to diffractive effects, the level of the radiation dose drops off across a transition zone. The position of the boundary of the pattern feature ultimately formed by the developed resist is determined by the position at which the received dose drops below the radiation dose threshold. The profile of the drop-off of radiation dose across the transition zone, and hence the precise position of the pattern feature boundary, can be controlled more precisely by setting the individually controllable elements that provide radiation to points on the substrate that are on or near the pattern feature boundary not only to maximum or minimum intensity levels but also to intensity levels between the maximum and minimum intensity levels. This is commonly referred to as "grayscaling."

Grayscaling provides greater control of the position of the pattern feature boundaries than is possible in a lithography system in which the radiation intensity provided to the substrate by a given individually controllable element can only be set to two values (namely just a maximum value and a minimum value). In an embodiment, at least three different radiation intensity values can be projected onto the substrate, e.g., at least 4 radiation intensity values, at least 8 radiation intensity values, at least 16 radiation intensity values, at least 32 radiation intensity values, at least 64 radiation intensity values, at least 128 radiation intensity values, or at least 256 radiation intensity values.

It should be appreciated that grayscaling can be used for additional or alternative purposes to that described above. For example, the processing of the substrate after the exposure can be tuned, such that there are more than two potential responses of regions of the substrate, dependent on received radiation dose level. For example, a portion of the substrate receiving a radiation dose below a first threshold responds in a first manner; a portion of the substrate receiving a radiation dose above the first threshold but below a second threshold responds in a second manner; and a portion of the substrate receiving a radiation dose above the second threshold responds in a third manner. Accordingly, grayscaling can be used to provide a radiation dose profile across the substrate having more than two desired dose levels. In an embodiment, the radiation dose profile has at least 2 desired dose levels, e.g., at least 3 desired radiation dose levels, at least 4 desired radiation dose levels, at least 6 desired radiation dose levels or at least 8 desired radiation dose levels.

It should further be appreciated that the radiation dose profile can be controlled by methods other than by merely controlling the intensity of the radiation received at each point on the substrate, as described above. For example, the radiation dose received by each point on the substrate can alternatively or additionally be controlled by controlling the duration of the exposure of the point. As a further example, each point on the substrate can potentially receive radiation in a plurality of successive exposures. The radiation dose received by each point can, therefore, be alternatively or additionally controlled by exposing the point using a selected subset of the plurality of successive exposures.

In order to form the required pattern on the substrate, it is necessary to set each of the individually controllable elements in the patterning device to the requisite state at each stage during the exposure process. Therefore, control signals, representing the requisite states, must be transmitted to each of the individually controllable elements. In one example, the lithographic apparatus includes a controller that generates the control signals. The pattern to be formed on the substrate can be provided to the lithographic apparatus in a vector-defined format, such as GDSII. In order to convert the design information into the control signals for each individually controllable element, the controller includes one or more data manipulation devices, each configured to perform a processing step on a data stream that represents the pattern. The data manipulation devices can collectively be referred to as the "datapath."

The data manipulation devices of the datapath can be configured to perform one or more of the following functions: converting vector-based design information into bitmap pattern data; converting bitmap pattern data into a required radiation dose map (namely a required radiation dose profile across the substrate); converting a required radiation dose map into required radiation intensity values for each individually controllable element; and converting the required radiation intensity values for each individually controllable element into corresponding control signals.

FIG. 2 depicts an arrangement of the apparatus according to the present invention that can be used, e.g., in the manufacture of flat panel displays. Components corresponding to those shown in FIG. 1 are depicted with the same reference numerals. Also, the above descriptions of the various embodiments, e.g., the various configurations of the substrate, the contrast device, the MLA, the beam of radiation, etc., remain applicable.

FIG. 2 depicts an arrangement of a lithographic apparatus, according to one embodiment of the present invention. This embodiment can be used, e.g., in the manufacture of flat panel displays. Components corresponding to those shown in FIG. 1 are depicted with the same reference numerals. Also, the above descriptions of the various embodiments, e.g., the various configurations of the substrate, the contrast device, the MLA, the beam of radiation, etc., remain applicable.

As shown in FIG. 2, the projection system PS includes a beam expander, which comprises two lenses L1, L2. The first lens L1 is arranged to receive the modulated radiation beam B and focus it through an aperture in an aperture stop AS. A further lens AL can be located in the aperture. The radiation beam B then diverges and is focused by the second lens L2 (e.g., a field lens).

The projection system PS further comprises an array of lenses MLA arranged to receive the expanded modulated radiation B. Different portions of the modulated radiation beam B, corresponding to one or more of the individually controllable elements in the patterning device PD, pass through respective different lenses in the array of lenses MLA. Each lens focuses the respective portion of the modulated radiation beam B to a point which lies on the substrate W. In this way an array of radiation spots S is exposed onto the substrate W. It will be appreciated that, although only eight lenses of the illustrated array of lenses 14 are shown, the array of lenses can comprise many thousands of lenses (the same is true of the array of individually controllable elements used as the patterning device PD).

Figure 3:
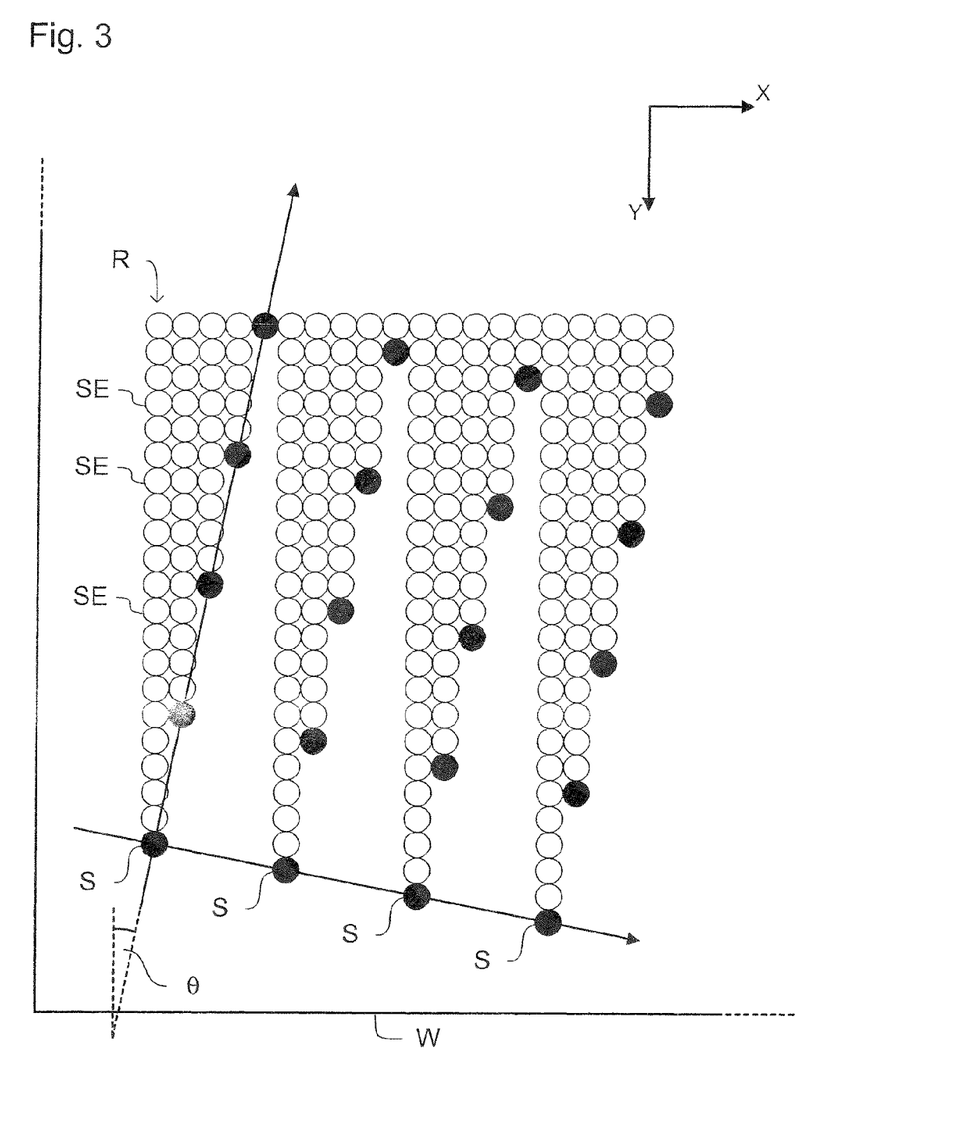
FIG. 3 depicts a mode of transferring a pattern to a substrate using an embodiment of the invention as show in FIG. 2.

FIG. 3 illustrates schematically how a pattern on a substrate W is generated using the system of FIG. 2, according to one embodiment of the present invention. The filled in circles represent the array of spots S projected onto the substrate W by the array of lenses MLA in the projection system PS. The substrate W is moved relative to the projection system PS in the Y direction as a series of exposures are exposed on the substrate W. The open circles represent spot exposures SE that have previously been exposed on the substrate W. As shown, each spot projected onto the substrate by the array of lenses within the projection system PS exposes a row R of spot exposures on the substrate W. The complete pattern for the substrate is generated by the sum of all the rows R of spot exposures SE exposed by each of the spots S. Such an arrangement is commonly referred to as "pixel grid imaging," discussed above.

It can be seen that the array of radiation spots S is arranged at an angle $\theta$ relative to the substrate W (the edges of the substrate lie parallel to the X and Y directions). This is done so that when the substrate is moved in the scanning direction (the Y-direction), each radiation spot will pass over a different area of the substrate, thereby allowing the entire substrate to be covered by the array of radiation spots 15. In one example, the angle $\theta$ is at most 20°, 10°, e.g., at most 5°, at most 3°, at most 1°, at most 0.5°, at most 0.25°, at most 0.10°, at most 0.05°, or at most 0.01°. In one example, the angle $\theta$ is at least 0.001°.

Figure 4:
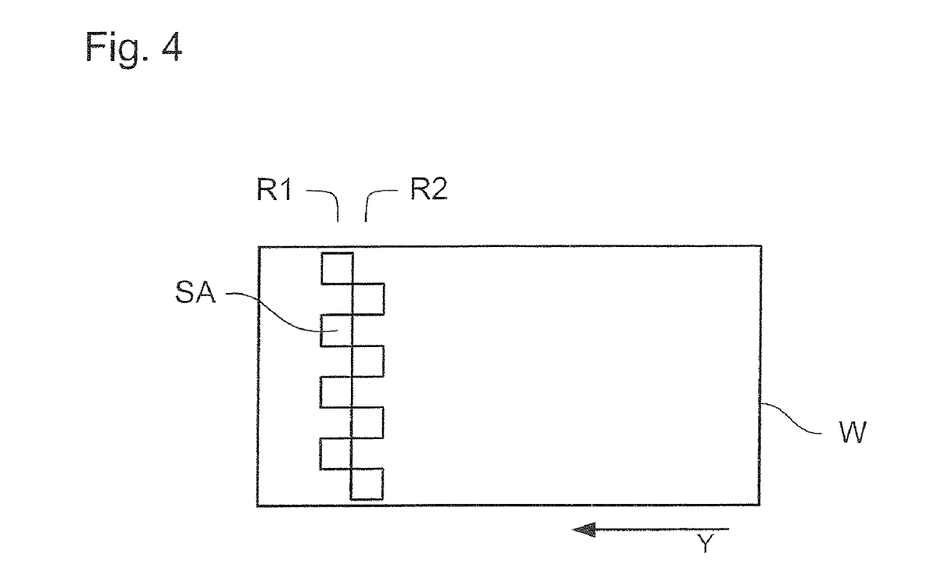
FIG. 4 depicts an arrangement of optical engines, according to one embodiment of the present invention.

FIG. 4 shows schematically how an entire flat panel display substrate W can be exposed in a single scan using a plurality of optical engines, according to one embodiment of the present invention. In the example shown eight arrays SA of radiation spots S are produced by eight optical engines (not shown), arranged in two rows R1, R2 in a "chess board" configuration, such that the edge of one array of radiation spots S slightly overlaps (in the scanning direction Y) with the edge of the adjacent array of radiation spots. In one example, the optical engines are arranged in at least 3 rows, for instance 4 rows or 5 rows. In this way, a band of radiation extends across the width of the substrate W, allowing exposure of the entire substrate to be performed in a single scan. It will be appreciated that any suitable number of optical engines can be used. In one example, the number of optical engines is at least 1, e.g., at least 2, at least 4, at least 8, at least 10, at least 12, at least 14, or at least 17. In one example, the number of optical engines is less than 40, e.g., less than 30 or less than 20.

Each optical engine can comprise a separate illumination system IL, patterning device PD and projection system PS as described above. It is to be appreciated, however, that two or more optical engines can share at least a part of one or more of the illumination system, patterning device and projection system.

Figure 5:
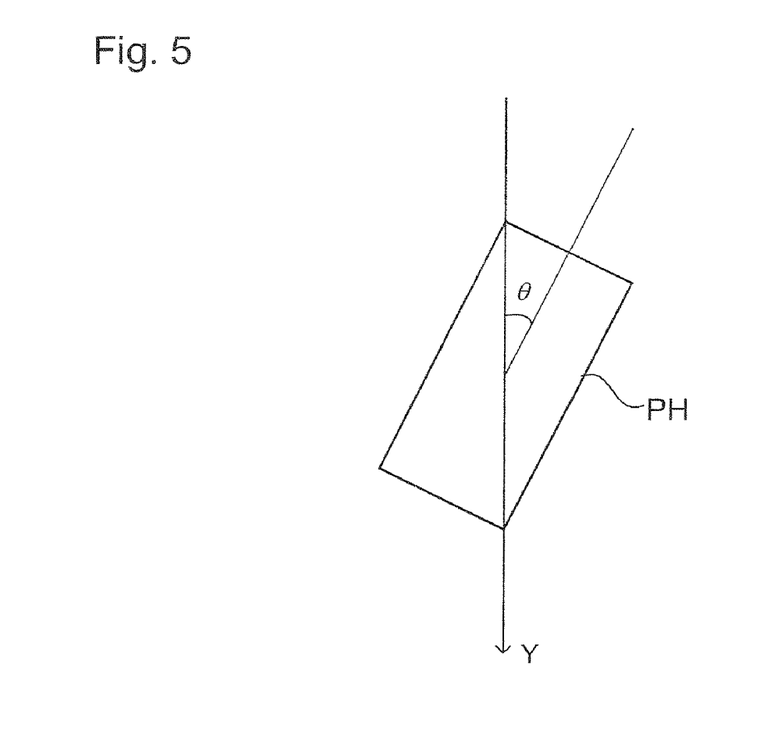
FIG. 5 shows the orientation of a print head relative to the direction of scanning of a substrate, according to one embodiment of the present invention.

FIG. 5 shows an orientation of a print head PH at an angle $\theta$ to a scan direction y, according to one embodiment of the present invention. In this orientation, the array of individually controllable elements is oriented at an angle $\theta$ to the scan direction, y. $\theta$ is chosen such that every nth line is printed, where n>1.

A print head in a lithographic apparatus is a part of the apparatus in which a pattern is applied to part or all of a beam of radiation that is projected onto the substrate. The print head may comprise an array of individually controllable elements or a plurality of arrays of individually controllable elements, mounted on a common support. The print head may also include some or all of the components of the projection system, for example. If the print head has a plurality of arrays of individually controllable elements, some or all of the components of the projection system may be common for all of the arrays of individually controllable elements. Some or all of the components of the projection system, however, may be used in conjunction with one of the arrays of individually controllable elements. It will be appreciated that the print head may include additional components.

FIGS. 6a, 6b, 7a, 7b, 8a, 8b, and 8c shows exposures, according to various embodiments of the present invention.

Figure 6A:
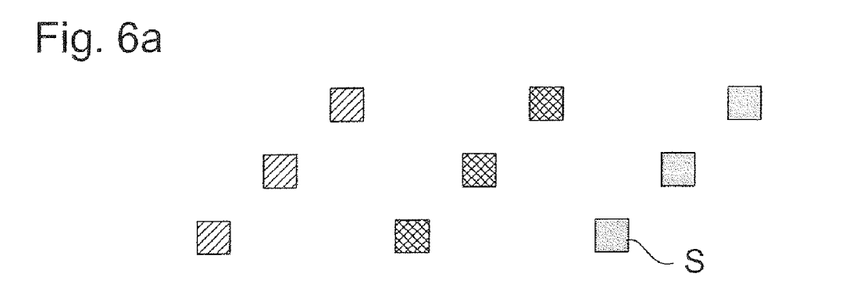
FIGS. 6a, 6b, 7a, 7b, 8a, 8b, 8c, 9 and 10 shows exposures, according to various embodiments of the present invention.

In FIG. 6a a spot is printed in every second line. FIG. 6a shows the spots, S, exposed on a substrate after a first exposure by three print heads. The exposures by the first print head are shown as hashed, exposures by a second print head are shown as crossed, and the exposures by a third print head are shown as shaded. The substrate is then shifted relative to the print head (or the print head shifted relative to the substrate) in a direction perpendicular to the scanning direction.

Figure 6B:
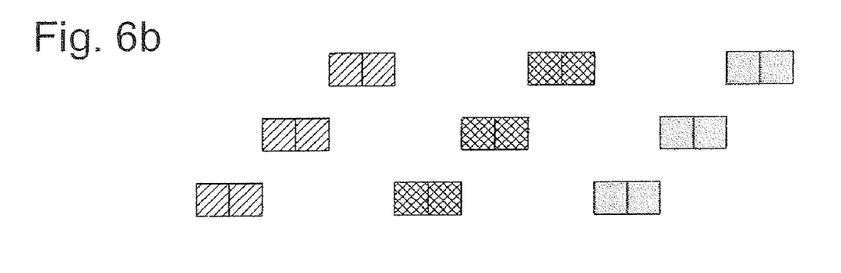

A second exposure then takes place, as shown in FIG. 6b, with each of the spots exposed during the second exposure alternating with the spots exposed during the first exposure in a direction perpendicular to the scanning direction—this is so called "interlacing." The errors resulting from the shift in the substrate position perpendicular to the scanning direction are thus distributed across the width of the substrate rather than being confined to the stitching zone. The spatial frequency of the stitching errors is high, so they are less visible to the human eye.

Although described here using just the exposure of individual spots, in one example entire rows R of spots are generally exposed (as described above in conjunction with FIG. 3), followed by the second plurality of spots (or rows), which can also comprise rows R of spots.

Figure 7A:
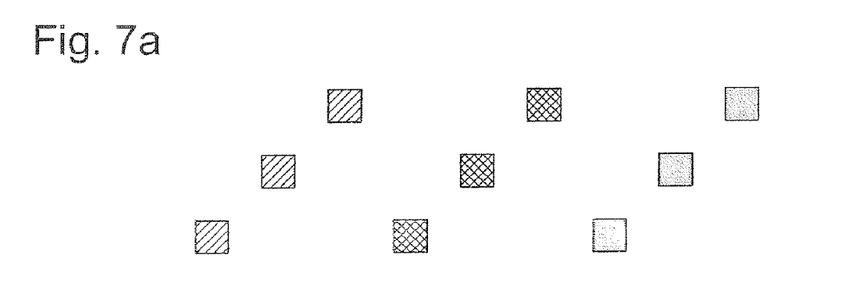
Figure 7B:
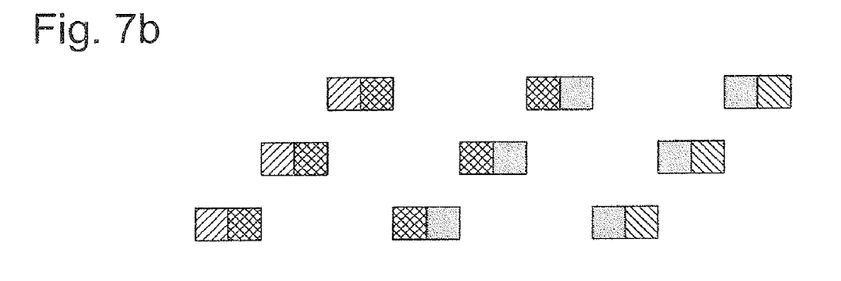

FIGS. 7a and 7b show a similar method in which the shift in the substrate between the first and second exposures is sufficiently large, such that the second exposures from the second print head are interlaced with the first exposures from the first print head. This ensures that errors introduced into stitching zones as a result of misalignment of neighboring print heads are interlaced across substrates.

Figure 8A:
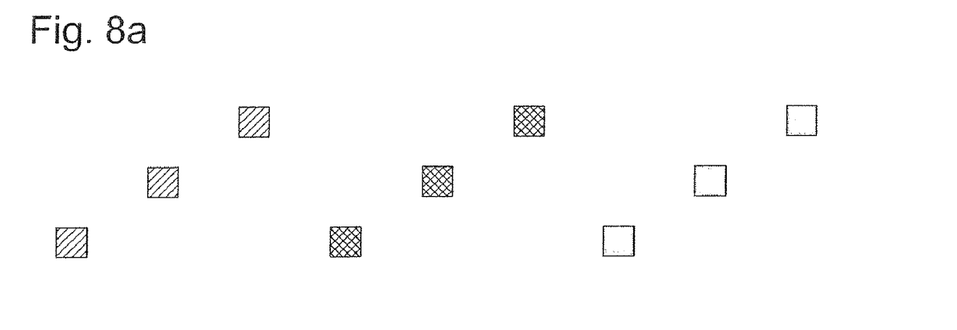
Figure 8B:
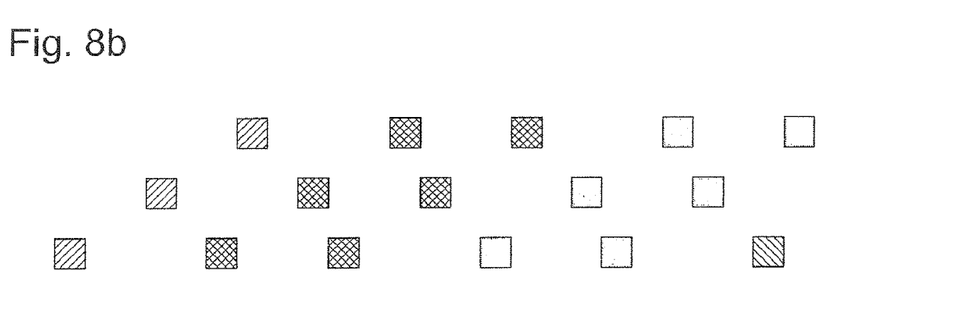
Figure 8C:
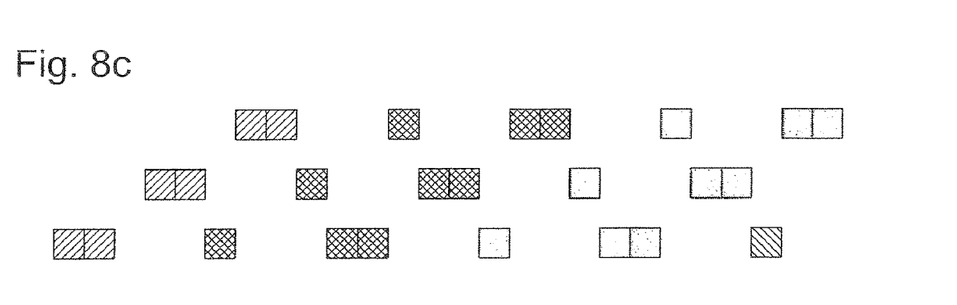

FIGS. 6a, 6b, 7a, and 7b show arrangements in which the print heads are arranged to print every second line (n=2), whereas FIG. 8a shows an arrangement in which each print head prints every third line (n=3). FIG. 8b shows spots exposed after the second exposure. With the print head arranged to print every third line, a third exposure is also needed to complete each line, and FIG. 8c shows this. In other examples, the apparatus could also be arranged to print every fourth, fifth, sixth etc line.

Figure 9:
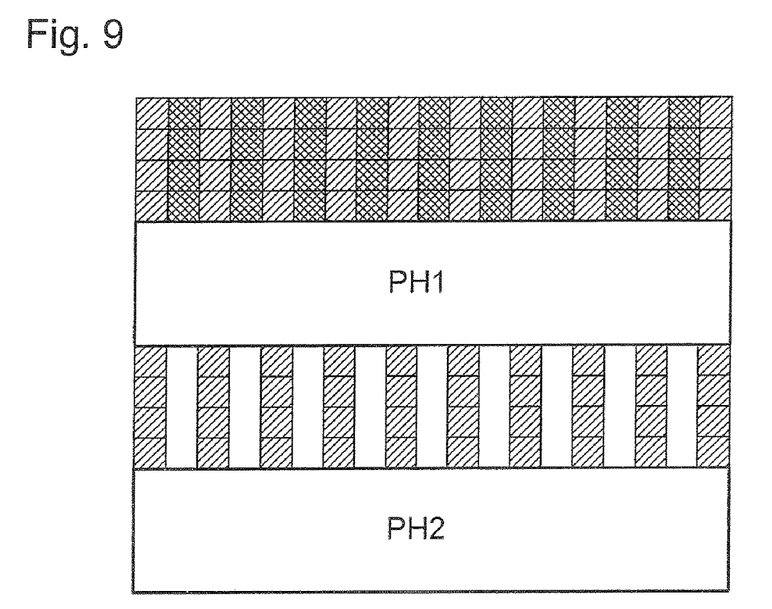

As an alternative to shifting the substrate relative to the printing heads to generate the subsequent interlaced spots, an additional print head or print heads could be arranged downstream in the scanning direction, y. This is shown in FIG. 9 in which the first print head PH1 exposes a first plurality of spots (shown as hashed). In FIG. 9, all previously exposed spots are also shown, in a similar manner to FIG. 3. A second print head PH2 then exposes a second plurality of spots (shown as crossed), each arranged between each of the first plurality of spots in the x direction (perpendicular to the y scanning direction). It is to be appreciated that, although only one print head is shown in the x direction, in various examples there can be several print heads in the x direction. Also, there could be more than two print heads in the y direction.

Described above is interlacing in the x direction, but in other examples interlacing can also take place in the y direction either in addition to, or alternatively, to interlacing in the x direction.

Figure 10:
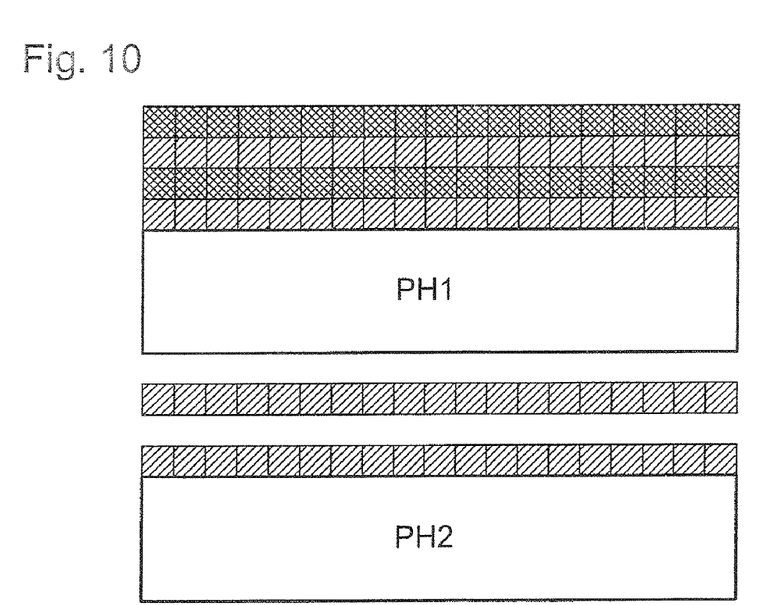

FIG. 10 shows a first plurality of spots (shown as hashed) exposed by a first print head PH1. Downstream in the scanning direction, y, is a second print head PH2 which exposes a second plurality of spots (shown as crossed), each of the second plurality of spots arranged between each of the first plurality of spots. Thus, as can be seen, the combined effect of the first and second spot exposures is to allow the entire substrate to be exposed. In this embodiment the timing of the exposures of the first and second print heads, PH1 and PH2, respectively, must be accurately controlled to ensure that the exposures are accurately interlaced.

In one example, as an alternative to the embodiment shown in FIG. 10, all of the first plurality of spots are exposed by a print head or heads, the substrate W is then shifted relative to the print head or heads, such that the second plurality of spots, each arranged between each of the first plurality of spots in the y direction, can be exposed by the same print head or heads. The relative shift between the substrate and the print head(s) can be in the y direction or a combination of the x and y directions.

Although specific reference can be made in this text to the use of lithographic apparatus in the manufacture of a specific device (e.g., an integrated circuit or a flat panel display), it should be understood that the lithographic apparatus described herein can have other applications. Applications include, but are not limited to, the manufacture of integrated circuits, integrated optical systems, guidance and detection patterns for magnetic domain memories, flat-panel displays, liquid-crystal displays (LCDs), thin-film magnetic heads, micro-electromechanical devices (MEMS), etc. Also, for instance in a flat panel display, the present apparatus can be used to assist in the creation of a variety of layers, e.g., a thin film transistor layer and/or a color filter layer.

Although specific reference can have been made above to the use of embodiments of the invention in the context of optical lithography, it will be appreciated that the invention can be used in other applications, for example imprint lithography, where the context allows, and is not limited to optical lithography. In imprint lithography topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:

1. A device manufacturing method, comprising:
generating a first patterned beam with a first print head;
projecting the first patterned beam onto a substrate to form a first plurality of spot exposures on the substrate;
scanning the substrate in a direction while projecting the first patterned beam;
generating a second patterned beam with a second print head;
projecting the second patterned beam onto the substrate to form a second plurality of spot exposures on the substrate; and
alternating spot exposures of the first plurality of spot exposures with respective spot exposures of the second plurality of spot exposures.

2. The method of claim 1, further comprising:
establishing the direction as a first direction; and
extending at least one of the first and second plurality of radiation spots substantially across the width of the substrate in a second direction that is perpendicular to the first direction.

3. The method of claim 1, further comprising:
using a first array of laser or light emitting diodes to perform the generating the first patterned beam; and
using a second array of laser or light emitting diodes to perform the generating the second patterned beam.

4. The method of claim 1, further comprising:
establishing the direction as a first direction; and
the alternating comprising alternating spot exposures of the first plurality of spot exposures with respective spot exposures of the second plurality of spot exposures in a second direction that is perpendicular to the first direction.

5. The method of claim 1, wherein the alternating comprises alternating spot exposures of the first plurality of spot exposures with respective spot exposures of the second plurality of spot exposures in the direction.

6. A device manufacturing method, comprising:
generating a first patterned beam with each of a plurality of print heads;
projecting the first patterned beam onto a substrate to generate a first plurality of spot exposures on the substrate;
scanning the substrate in a first direction while projecting the plurality of radiation spots;
shifting the substrate relative to the projection of the patterned beam in a second direction perpendicular to the first direction;
generating a second patterned beam with each of the plurality of print heads;
projecting the second patterned beam onto the substrate to generate a second plurality of spot exposures on the substrate; and
alternating spot exposures of the second plurality of spot exposures with respective spot exposures of the first plurality of spot exposures.

7. The method of claim 6, further comprising:
extending at least one of the first and second plurality of radiation, spots substantially across a width of the substrate in the second direction.

8. The method of claim 6, further comprising:
using an array of laser diodes or an array of light emitting diodes to perform the generating of the first and second patterned beams.

9. The method of claim 6, wherein the alternating comprises alternating spot exposures of the second plurality of spot exposures with respective spot exposures of the first plurality of spot exposures in the second direction.

10. The method of claim 6, wherein the alternating comprises alternating spot exposures of the second plurality of spot exposures with respective spot exposures of the first plurality of spot exposures in the first direction.

11. A method for manufacturing a flat panel display, comprising:

generating a first patterned beam with each of a first plurality of print heads;

projecting the first patterned beam onto a substrate to generate a first plurality of spot exposures on the substrate;

scanning the substrate in a first direction while projecting the plurality of radiation spots;

shifting the substrate relative to the projection of the patterned beam in a second direction perpendicular to the first direction;

generating a second patterned beam with each of a second plurality of print heads;

projecting the second patterned beam onto the substrate to generate a second plurality of spot exposures on the substrate; and alternating spot exposures of the second plurality of spot exposures with respective spot exposures of the first plurality of spot exposures.

* * * * *

UNITED STATES PATENT AND TRADEMARK OFFICE
CERTIFICATE OF CORRECTION

PATENT NO. : 8,003,308 B2  
APPLICATION NO. : 12/775073  
DATED : August 23, 2011  
INVENTOR(S) : Pieter Johannes Marius Van Groos

Page 1 of 1

It is certified that error appears in the above-identified patent and that said Letters Patent is hereby corrected as shown below:

Title Page, Item (56), References Cited section, under "U.S. PATENT DOCUMENTS" please add
-- 7,742,148 B2 06/2010 Van Groos --

Title Page, Item (56), References Cited section, under "U.S. PATENT DOCUMENTS" please add
-- 2003/0197843 A1 10/2003 Mulkens et al. --

Signed and Sealed this
Twenty-ninth Day of May, 2012

David J. Kappos
*Director of the United States Patent and Trademark Office*